(12) United States Patent
Sung et al.

(10) Patent No.: US 11,316,138 B2
(45) Date of Patent: Apr. 26, 2022

(54) DISPLAY DEVICE AND MANUFACTURING METHOD THEREOF

(71) Applicant: Samsung Display Co., LTD., Yongin-si (KR)

(72) Inventors: Tae Hyun Sung, Seoul (KR); Woo Hyun Kim, Hwaseong-si (KR); Hyo Jin Kim, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 31 days.

(21) Appl. No.: 16/674,092

(22) Filed: Nov. 5, 2019

(65) Prior Publication Data
US 2020/0287169 A1    Sep. 10, 2020

(30) Foreign Application Priority Data

Mar. 6, 2019  (KR) .......................... 10-2019-0025810

(51) Int. Cl.
| | |
|---|---|
| *H05K 1/00* | (2006.01) |
| *H05K 1/02* | (2006.01) |
| *H05K 3/00* | (2006.01) |
| *H05K 3/22* | (2006.01) |
| *H05K 3/46* | (2006.01) |

(Continued)

(52) U.S. Cl.
CPC .......... *H01L 51/56* (2013.01); *H01L 51/0097* (2013.01); *H05K 1/147* (2013.01); *H05K 1/189* (2013.01); *H01L 27/3244* (2013.01)

(58) Field of Classification Search
CPC .. H05K 1/00; H05K 1/02; H05K 3/00; H05K 3/22; H05K 3/46; H01L 21/02; H01L 21/306; H01L 27/12; H01L 27/32; H01L 51/00; H01L 51/52; H01L 51/56; G02F 1/136; G02F 1/1335; G02F 1/1337; G02F 1/1343; G06F 1/16; G06F 3/041; G06F 3/044
USPC ................ 361/749, 820; 345/173, 174, 205; 156/211, 275.7, 327; 445/24, 25; 438/26, 28, 618, 669
See application file for complete search history.

(56) References Cited

U.S. PATENT DOCUMENTS 9,173,287 B1 * 10/2015 Kim ...................... G06F 1/1616
9,204,565 B1 * 12/2015 Lee ........................ E05D 3/022
(Continued)

FOREIGN PATENT DOCUMENTS

KR    1020170140490 A    12/2017

*Primary Examiner* — Xiaoliang Chen
(74) *Attorney, Agent, or Firm* — Cantor Colburn LLP (57) ABSTRACT

A manufacturing method of a display device, includes: providing a display module bendable at a bending area and including: a passivation film including a polyimide and disposed both in and outside of the bending area, and an adhesive layer attaching a display panel to the passivation film and including a first adhesive portion in the bending area and a second adhesive portion outside of the bending area; reducing an adhesive force of the first adhesive portion, by irradiating a first laser which is a $CO_2$ laser to the adhesive layer at the bending area, to provide the first adhesive portion which has reduced adhesive force; providing a groove in the passivation film and the adhesive layer, along a boundary of the bending area; and removing the passivation film and the first adhesive portion which has the reduced adhesive force, from the display panel, at the groove.

10 Claims, 10 Drawing Sheets

(51) Int. Cl.
    *H01L 21/02*     (2006.01)
    *H01L 21/306*    (2006.01)
    *H01L 27/12*     (2006.01)
    *H01L 27/32*     (2006.01)
    *H01L 51/00*     (2006.01)
    *H01L 51/52*     (2006.01)
    *H01L 51/56*     (2006.01)
    *G02F 1/136*     (2006.01)
    *G02F 1/1335*    (2006.01)
    *G02F 1/1337*    (2006.01)
    *G02F 1/1343*    (2006.01)
    *G06F 1/16*      (2006.01)
    *G06F 3/041*     (2006.01)
    *G06F 3/044*     (2006.01)
    *H05K 1/14*      (2006.01)
    *H05K 1/18*      (2006.01)

(56) References Cited

U.S. PATENT DOCUMENTS

| | | | | |
|---|---|---|---|---|
| 9,287,329 B1* | 3/2016 | Lee | | H01L 51/0097 |
| 10,103,351 B1* | 10/2018 | Li | | H01L 27/3276 |
| 10,141,540 B2 | 11/2018 | Sung et al. | | |
| 10,719,103 B2* | 7/2020 | Chung | | G02F 1/13458 |
| 2004/0012337 A1* | 1/2004 | Oohata | | H01L 24/24 |
| | | | | 315/169.3 |
| 2009/0305503 A1* | 12/2009 | Sakamoto | | H01L 21/76838 |
| | | | | 438/669 |
| 2011/0026236 A1* | 2/2011 | Kondo | | B32B 7/06 |
| | | | | 361/820 |
| 2013/0249877 A1* | 9/2013 | Choi | | H01L 27/1248 |
| | | | | 345/205 |
| 2014/0134763 A1* | 5/2014 | Park | | H01L 51/0014 |
| | | | | 438/26 |
| 2014/0306985 A1* | 10/2014 | Jeong | | G09G 5/06 |
| | | | | 345/601 |
| 2014/0368228 A1* | 12/2014 | Kim | | H01L 51/0097 |
| | | | | 324/750.3 |
| 2015/0227172 A1* | 8/2015 | Namkung | | G06F 1/1652 |
| | | | | 345/173 |
| 2015/0250038 A1* | 9/2015 | Sakuishi | | H01L 29/78603 |
| | | | | 445/25 |
| 2015/0380680 A1* | 12/2015 | Sakuishi | | H01L 27/3246 |
| | | | | 257/99 |
| 2017/0092708 A1* | 3/2017 | Jeon | | H01L 27/127 |
| 2017/0271616 A1* | 9/2017 | Choi | | H01L 51/5253 |
| 2017/0278918 A1* | 9/2017 | Jeon | | H01L 27/3276 |
| 2017/0323779 A1* | 11/2017 | Um | | H01L 27/1218 |
| 2017/0352834 A1* | 12/2017 | Kim | | H01L 51/0097 |
| 2018/0004023 A1* | 1/2018 | Ide | | G02F 1/136 |
| 2018/0019267 A1* | 1/2018 | Saeki | | H01L 21/67092 |
| 2018/0076400 A1* | 3/2018 | Jung | | B32B 27/322 |
| 2018/0090702 A1* | 3/2018 | Um | | H01L 51/0097 |
| 2018/0166652 A1* | 6/2018 | Kim | | B32B 3/30 |
| 2018/0175323 A1* | 6/2018 | Ahn | | H01L 51/0097 |
| 2018/0182983 A1* | 6/2018 | Bae | | B32B 15/085 |
| 2018/0284935 A1* | 10/2018 | Lee | | G06F 1/1652 |
| 2019/0011954 A1* | 1/2019 | Chu | | B32B 7/12 |
| 2019/0022901 A1* | 1/2019 | Tanaka | | B65H 29/56 |
| 2019/0165049 A1* | 5/2019 | Kim | | H01L 27/323 |
| 2019/0165310 A1* | 5/2019 | Kinjo | | H01L 51/5281 |
| 2019/0198586 A1* | 6/2019 | Kim | | G09G 3/3208 |
| 2019/0213925 A1* | 7/2019 | Ha | | G06F 3/03547 |
| 2019/0281692 A1* | 9/2019 | Jeon | | H05K 1/028 |
| 2019/0363304 A1* | 11/2019 | Tanaka | | G09F 9/30 |
| 2020/0013987 A1* | 1/2020 | Lee | | H01L 51/0097 |
| 2020/0064968 A1* | 2/2020 | Kim | | H01L 27/323 |

* cited by examiner

DISPLAY DEVICE AND MANUFACTURING METHOD THEREOF

This application claims priority to Korean Patent Application No. 10-2019-0025810 filed on Mar. 6, 2019, and all the benefits accruing therefrom under 35 U.S.C. § 119, the entire contents of which are incorporated herein by reference.

BACKGROUND

(a) Field

The present disclosure relates to a display device and a manufacturing method thereof.

(b) Description of the Related Art

Since the light emitting diode display has a self-emission characteristic and does not use an additional light source, unlike a liquid crystal display device, reducing a thickness and a weight of the light emitting diode display is possible. Further, the light emitting diode display has high-quality characteristics such as relatively low power consumption, relatively high luminance and relatively high response speed.

The light emitting diode display includes a light emitting diode including two electrodes and a light emitting layer which is disposed between the two electrodes. When holes and electrons are injected into the light emitting layer from the two electrodes, respectively, light is emitted by the light emitting diode when excitons in which the injected holes and electrons are combined enter a ground state from an excited state.

A flexible substrate has been applied to the light emitting diode display to reduce a dead space and a bezel, and a structure of the light emitting diode display is applied on the flexible substrate at a bending area thereof.

SUMMARY

The invention has been made in an effort to provide a display device including a bending area that may be easily manufactured.

An embodiment of the invention provides a manufacturing method of a display device, including: providing a display module which is bendable at a bending area thereof, the display module including: a display panel which displays an image, a passivation film including a polyimide, the passivation film disposed in the bending area and outside of the bending area, and an adhesive layer which attaches the display panel to the passivation film, the adhesive layer including a first adhesive portion in the bending area and a second adhesive portion outside of the bending area; reducing an adhesive force of the first adhesive portion of the adhesive layer to be smaller than an adhesive force of the second adhesive portion of the adhesive layer, by irradiating a first laser to the adhesive layer at the bending area, to provide the first adhesive portion which has reduced adhesive force; providing a groove in the passivation film and in the adhesive layer, along a boundary of the bending area; and removing the passivation film and the first adhesive portion which has the reduced adhesive force, from the display panel, at the groove. The first laser is a $CO_2$ laser.

The first laser may be irradiated through the passivation film and to the adhesive layer to provide the first adhesive portion which has the reduced adhesive force.

The providing the groove in the passivation film and the adhesive layer may include removing a portion of the passivation film and a portion of the adhesive layer disposed at the boundary of the bending area, by irradiating a second laser to the passivation film and the adhesive layer along the boundary of the bending area.

The second laser may be irradiated in a direction from the passivation film to the adhesive layer.

A width of the groove taken along the display panel may decrease in the direction from the passivation film to the display panel.

The second laser may be a CO2 laser, and an intensity of the first laser may be less than that of the second laser.

The second laser may be an ultraviolet laser.

The display module may include a display area at which the image is displayable and a non-display area which is adjacent to the display area.

The bending area may be disposed in the non-display area.

The bending area may be disposed in the display area.

The manufacturing method of the display device may further include bending the display module from which the passivation film and the first adhesive portion which has the reduced adhesive force have been removed, at the bending area.

Another embodiment of the invention provides a display device including: a display module including: a display area at which an image is displayed and a non-display area which is adjacent to the display area, a bending area at which the display module is bendable, a display panel which displays the image, a passivation film including a polyimide, an adhesive layer which attaches the display panel to the passivation film, and in the bending area, an opening provided in each of the passivation film and the adhesive layer; a printed circuit board which provides an electrical signal; and a flexible printed circuit film attached to the display module and through which the electrical signal is provided from the printed circuit board to the display module.

According to one or more embodiment, a display device including a bending area may be easily manufactured by irradiating a $CO_2$ laser to weaken adhesive force of a portion of an adhesive layer which is disposed at the bending area, and then by removing a passivation film and the adhesive layer which has the weakened adhesive force disposed in the bending area.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

The invention will be described more fully hereinafter with reference to the accompanying drawings, in which exemplary embodiments of the invention are shown. As those skilled in the art would realize, the described embodiments may be modified in various different ways, all without departing from the spirit or scope of the present disclosure.

Parts that are irrelevant to the description will be omitted to clearly describe the present disclosure, and like reference numerals designate like elements throughout the specification.

Further, in the drawings, the size and thickness of each element are arbitrarily illustrated for ease of description, and the present disclosure is not necessarily limited to those illustrated in the drawings. In the drawings, the thicknesses of layers, films, panels, regions, etc., are exaggerated for clarity. In the drawings, for ease of description, the thicknesses of some layers and areas are exaggerated.

It will be understood that when an element such as a layer, film, region, or substrate is referred to as being related to another element such as being "on" another element, it can be directly on the other element or intervening elements may also be present. In contrast, when an element is referred to as being related to another element such as being "directly on" another element, there are no intervening elements present. Further, in the specification, the word "on" or "above" means disposed on or below the object portion, and does not necessarily mean disposed on the upper side of the object portion based on a gravitational direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. In addition, unless explicitly described to the contrary, the word "comprise" and variations such as "comprises," "includes," "comprising" or "including" will be understood to imply the inclusion of stated elements but not the exclusion of any other elements.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Further, throughout the specification, the phrase "on a plane" means viewing a target portion from the top, and the phrase "on a cross-section" means viewing a cross-section formed by vertically cutting a target portion from the side.

Figure 1:
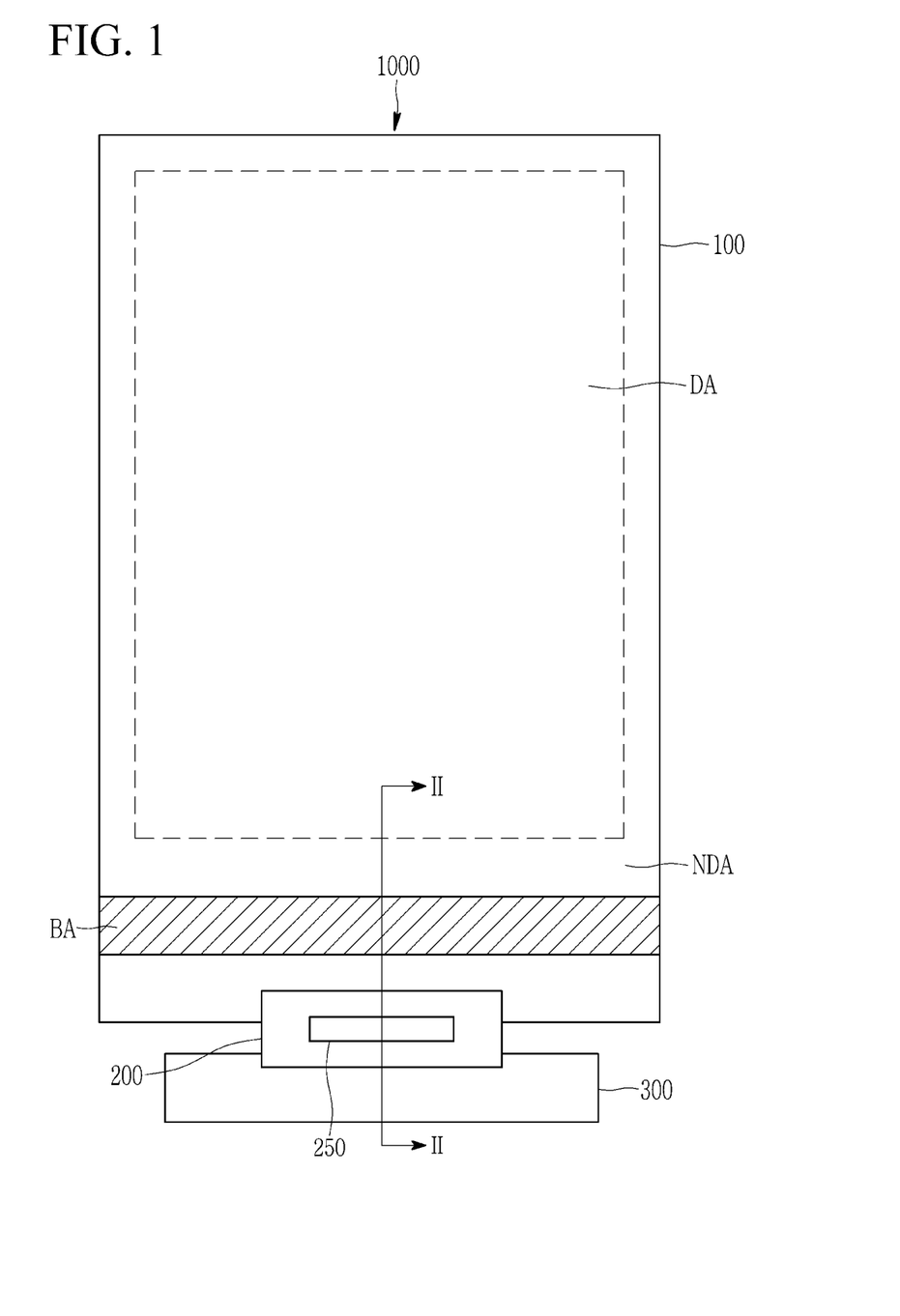
FIG. 1 schematically illustrates a top plan view of an embodiment of a display device.
Figure 2:
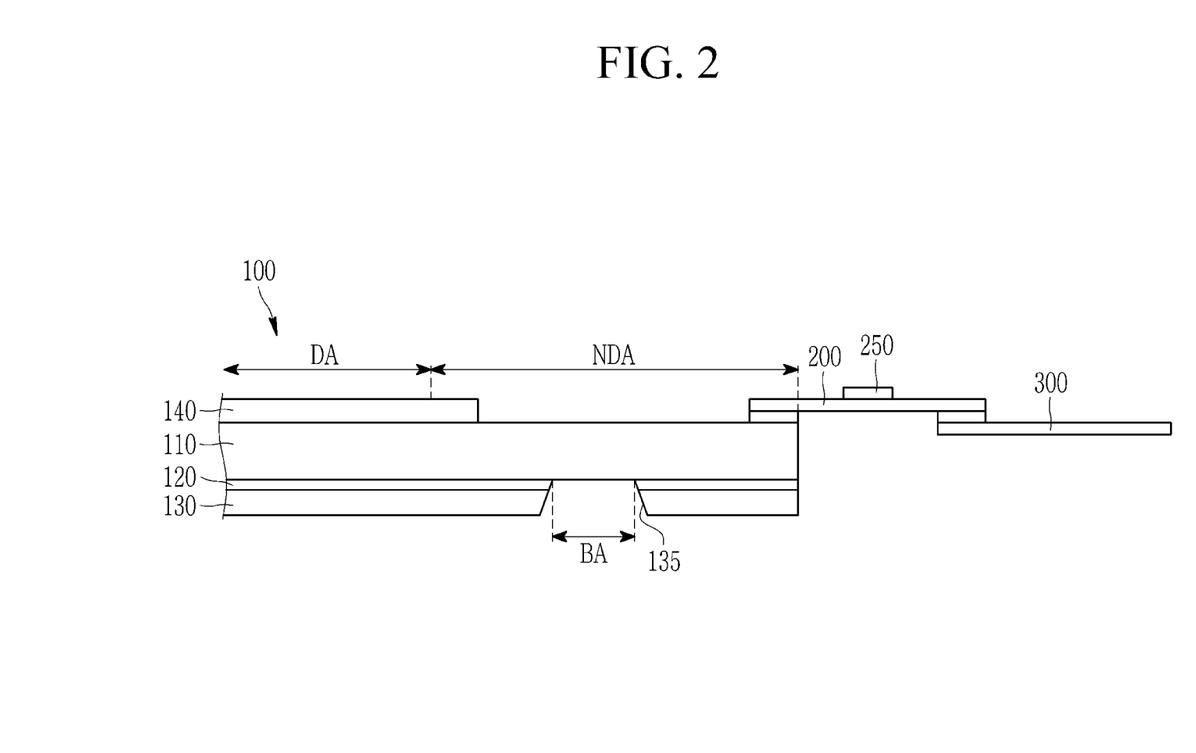
FIG. 2 is a cross-sectional view taken along line II-II of FIG. 1.
Figure 3:
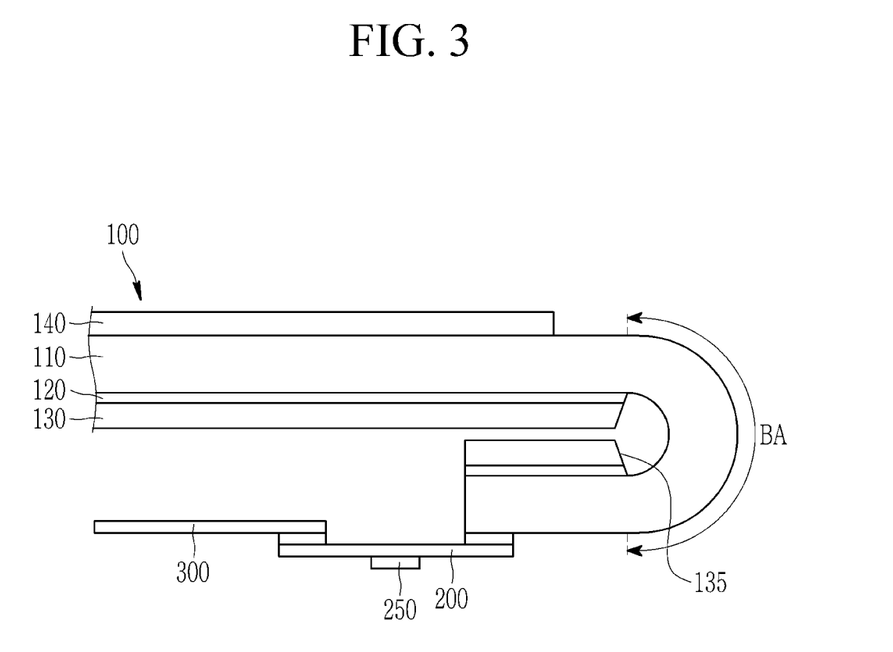
FIG. 3 schematically illustrates a side view of the display device of FIG. 1, which is bent.

FIG. 1 schematically illustrates a top plan view of an embodiment of a display device. FIG. 2 is a cross-sectional view taken along line II-II of FIG. 1. FIG. 3 schematically illustrates a side view of the display device of FIG. 1 which is bent.

Referring to FIG. 1 to FIG. 3, a display device 1000 includes a display module 100, a printed circuit board 300, and a flexible printed circuit film 200 which connects the display module 100 and the printed circuit board 300 to each other.

The display device 1000 and various components thereof may be disposed in a plane defined by a first direction and a second direction which cross each other. Referring to FIG. 1, the horizontal direction may represent one direction among the first direction and the second direction, while the vertical direction may represent the other direction among the first direction and the second direction. A thickness of the display device 1000 and various components thereof may be defined along a third direction which crosses each of the first direction and the second direction. Referring to FIG. 2 and FIG. 3, the vertical direction may represent the third direction, e.g., a thickness direction.

The display module 100 generates and/or displays an image. The display module 100 includes a display area DA at which an image is displayable, and a non-display area NDA in which elements and/or wires for generating and/or transmitting various signals applied to the display area DA are disposed. An image may not be displayed at the non-display area NDA. The non-display area NDA is disposed adjacent to the display area DA, such as being around or surrounding the display area DA in the top plan view. In addition, the display module 100 includes a bending area BA. The bending area BA is disposed in the non-display area NDA. The display module 100, the display device 1000 and/or components thereof may be bendable at the bending area BA.

A first end of the flexible printed circuit film 200 is attached to the non-display area NDA of the display module 100, and a second end of the flexible printed circuit film 200 which is opposite to the first end thereof is attached to the printed circuit board 300. A driving circuit portion 250 is disposed on the flexible printed circuit film 200. The driving circuit portion 250 may include a driver, an integrated circuit and the like, without being limited thereto.

The printed circuit board 300 generates an electrical signal such as a driving signal for driving the display module 100 and a plurality of control signals for applying the driving signal at an appropriate time, and applies these signals to the display module 100 through the flexible printed circuit film 200 and the driving circuit portion 250.

The display module 100 is bendable in the bending area BA. Referring to FIG. 3, the display module 100 which is bent disposes a portion of the display module 100 and the flexible printed circuit film 200 which is attached to the display module 100 facing a back surface of the display module 100 to minimize a planar dimension of the non-display area NDA which is visible from outside the display device 1000. In this case, the display module 100 which is bent also disposes the printed circuit board 300 connected to the flexible printed circuit film 200 facing the back surface of the display module 100.

The display module 100 includes a display panel 110, a passivation film 130, an adhesive layer 120, and a polarizing layer 140.

The display panel 110 generates and/or displays an image. The display panel 110 includes a plurality of pixels at which an image is generated or displayed or at which light is generated or emitted for displaying an image, conductive wires or conductive signal wires connected thereto, and one or more insulating layer.

The passivation film 130 is disposed below the display panel 110 (e.g., at the back surface of the display module 100), and may support thereon and protect the display panel 110. The passivation film 130 may include a polyimide ("PI").

The adhesive layer 120 may attach the display panel 110 and the passivation film 130 to each other. The passivation film 130 and the adhesive layer 120 include or define an opening 135 therein which corresponds to (e.g., overlaps with) the bending area BA. A portion of the display panel 110 may be exposed to outside the display device 1000 at the opening 135. Since a number of layers of the display module 100 is reduced at the opening 135, such as to expose the display panel 110 to outside the display device 1000, the display module 100 may be easily bendable at the bending area BA.

The polarizing layer 140 is disposed on an upper side of the display panel 110 which is opposite to the back surface of the display module 100, and may serve to reduce reflection of external light.

The display module 100 may be bendable at the bending area BA. As shown in FIG. 3, the display module 100 which is bent disposes two portions of the passivation film 130 separated by the opening 135 so as to be relatively close to each other. As shown in FIG. 3, the two portions of the passivation film 130 face each other along a thickness direction of the display device 1000. The adhesive layer 120 and the passivation film 130 have a restoring force when such layers are bent. However, since portions of the passivation film 130 and the adhesive layer 120 each define the opening 135 therein corresponding to the bending area BA, the display module 100 may be easily bent at the bending area BA. That is, as the passivation film 130 and the adhesive layer 120 are omitted at the opening 135 at the bending area BA, the display module 100 may be easily bent at the bending area BA. The passivation film 130 and the adhesive layer 120 may be considered disconnected at the bending area BA to define the opening 135.

The display module 100 may further include a window layer (not shown), and at least one functional sheet for heat dissipation, light blocking, insulation, and the like. In an embodiment, the window layer is disposed on the polarizing layer 140 such as at a viewing side of the display device 1000 and may form an external surface of the display device 1000. The functional sheet is disposed below the display panel 110, that is, in a direction away from the viewing side of the display device 1000 along a thickness thereof.

Hereinafter, a stacked structure of the display panel 110 will be described.

Figure 4:
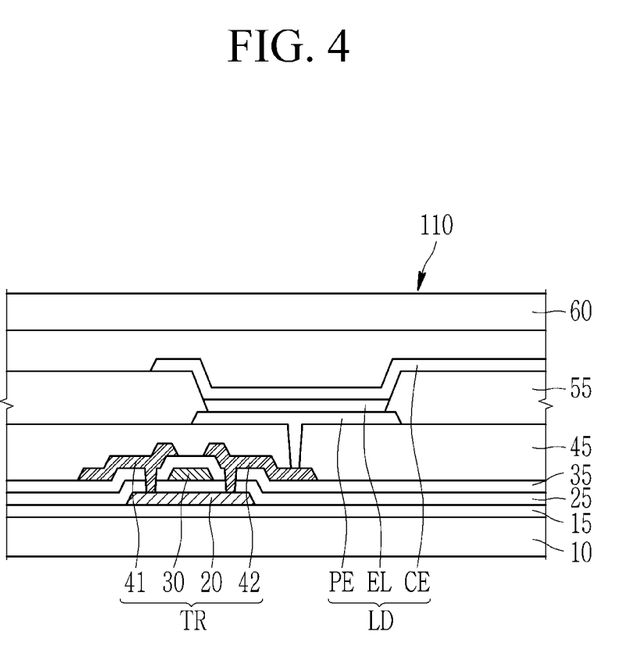
FIG. 4 is an enlarged cross-sectional view of an embodiment of a stacked structure of a display panel of a display device.

FIG. 4 is an enlarged cross-sectional view of an embodiment of a stacked structure of a display panel of a display device. The cross-section shown in FIG. 4 may substantially correspond to one pixel area. The pixel area may be a portion of a pixel among the plurality of pixels disposed in the display area DA discussed above.

Referring to FIG. 4, the display panel 110 includes a substrate 10 which includes an insulating material (e.g., an insulating substrate 10), a plurality of insulating layers 15, 25, 35, 45, and 55, a switching element TR (e.g., a transistor TR), a light emitting member LD (e.g., a light emitting diode LD), and an encapsulation substrate 60.

The insulating substrate 10 includes a flexible material. In an embodiment, for example, the insulating substrate 10 may include polyimide ("PI"), polyethylene naphthalate ("PEN"), polycarbonate ("PC"), polyarylate ("PAR"), polyether imide ("PEI"), and polyether sulfone ("PES").

A buffer layer 15 is disposed on the insulating substrate 10. The buffer layer 15 may block impurities that may be diffused from the insulating substrate 10 into a semiconductor layer 20, such as during a process of providing or forming the semiconductor layer 20 of the transistor TR, and may reduce stress of the insulating substrate 10 when a force is applied thereto.

The semiconductor layer 20 of the transistor TR is disposed on the buffer layer 15, and a gate insulating layer 25 is disposed on the semiconductor layer 20. The semiconductor layer 20 includes a source region, a drain region, and a channel region therebetween. The semiconductor layer 20 may include polycrystalline silicon, an oxide semiconductor or amorphous silicon. The gate insulating layer 25 may include an inorganic insulating material such as a silicon oxide, a silicon nitride or the like.

A gate conductor including a gate electrode 30 of the transistor TR is disposed on the gate insulating layer 25. The gate conductor may further include a signal line such as a gate line, through which an electrical signal such as a gate signal is transmitted to the pixel area. The gate conductor may include a conductive material or a metal such as molybdenum (Mo), copper (Cu), aluminum (Al), silver (Ag), chromium (Cr), tantalum (Ta), and titanium (Ti), or a metal alloy thereof.

An interlayer insulating layer 35 is disposed on the gate conductor. The interlayer insulating layer 35 may include an inorganic insulating material.

A data conductor including a source electrode 41 and a drain electrode 42 of the transistor TR is disposed on the interlayer insulating layer 35. The data conductor may further include a signal line such as a data line, through which an electrical signal such as a data signal is transmitted to the pixel area. The source electrode 41 and the drain electrode 42 are connected to the source region and the drain region of the semiconductor layer 20, at or through contact holes provided or formed in the interlayer insulating layer 35 and the gate insulating layer 25, respectively. The data conductor may include a conductive material or a metal such as, for example, aluminum (Al), copper (Cu), silver (Ag), molybdenum (Mo), chromium (Cr), gold (Au), platinum (Pt), palladium (Pd), tantalum (Ta), tungsten (W), titanium (Ti), nickel (Ni), and the like, or a metal alloy thereof.

A passivation layer 45 is disposed on the data conductor. The passivation layer 45 may include an organic insulating material.

A pixel electrode PE is disposed on the passivation layer 45. The pixel electrode PE may be connected to the drain electrode 42 at or through a contact hole provided or formed in the passivation layer 45 to receive a data signal for controlling brightness of the light emitting diode LD.

A pixel defining layer 55 is disposed on the passivation layer 45. The pixel defining layer 55 is provided with an opening corresponding to or overlapping with the pixel electrode PE. A light emitting layer EL is disposed on the pixel electrode PE in the opening of the pixel defining layer 55, and a common electrode CE is disposed on the light emitting layer EL. The pixel electrode PE, the light emitting layer EL and the common electrode CE together form the light emitting diode LD. The pixel electrode PE may be an anode of the light emitting diode LD, and the common electrode CE may be a cathode of the light emitting diode LD.

The encapsulation substrate 60 for protecting the light emitting diode LD is disposed on the common electrode CE. Instead of the encapsulation substrate 60, a thin film encapsulation layer may be disposed thereon.

In addition, the display panel 110 may include a touch sensing layer (not shown) with which a touch to the display device 1000, the display module 100 and/or the display panel 110 is sensed. In this case, the touch sensing layer may be disposed on the encapsulation substrate 60, and may include touch electrodes including or formed of a transparent conductive material such as an ITO or an IZO, a metal mesh, and the like. The touch electrodes may be provided or formed as a single layer or a multilayer.

A manufacturing method of a display device will now be described with reference to FIG. 5 to FIG. 9, as well as FIG. 1 to FIG. 3.

Figure 5:
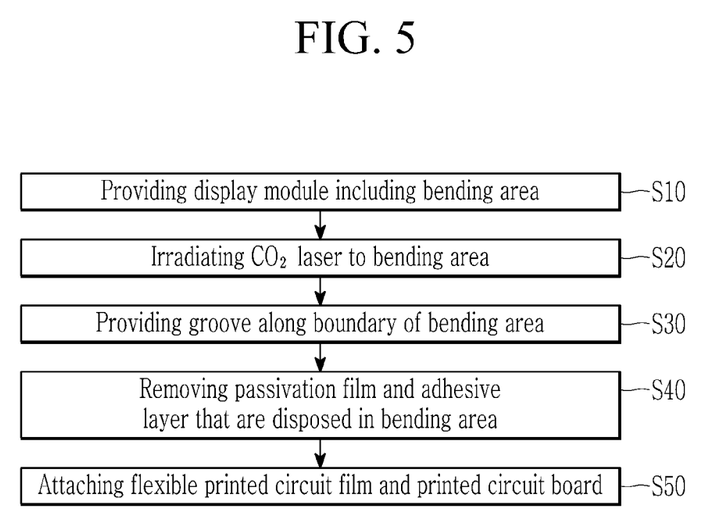
FIG. 5 is a flowchart of an embodiment of a manufacturing method of a display device.

FIG. 5 is a flowchart of an embodiment of a manufacturing method of a display device. FIG. 6 to FIG. 9 illustrate cross-sectional views of embodiments of stacked structures and processes within a manufacturing method of a display device.

Figure 6:
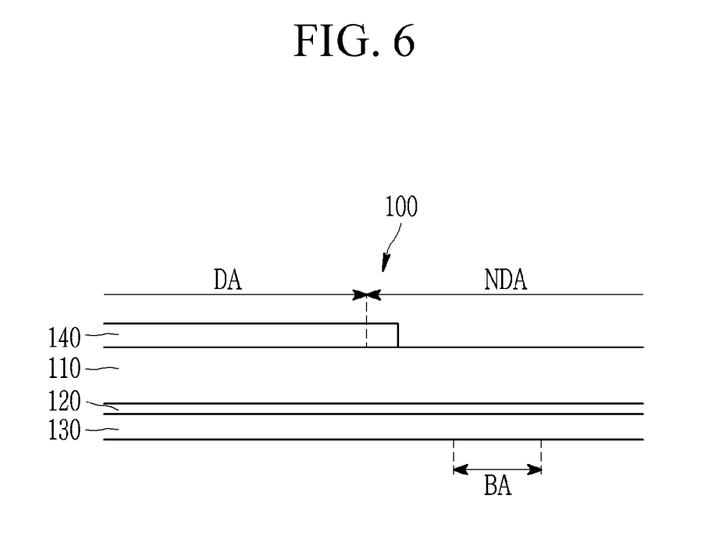
FIG. 6 to FIG. 9 illustrate cross-sectional views of embodiments of stacked structures and process within a manufacturing method of a display device.

Referring to FIG. 5 and FIG. 6, the display module 100 including the bending area BA is provided or formed (S10).

The display module 100 includes the display area DA at which an image is displayed, and the non-display area NDA in which elements with which light is emitted or an image is generated, and/or conductive wires with which various signals applied to the display area DA are generated and/or transmitted, are disposed. In addition, the display module 100 includes the display panel 110, the passivation film 130, the adhesive layer 120 and the polarizing layer 140 which together may form a stacked structure of the display module 100. The passivation film 130 is disposed under the display panel 110, and may include a polyimide. The adhesive layer 120 may attach the display panel 110 and the passivation film 130 together. The polarizing layer 140 is disposed on an upper portion of the display panel 110, and may form an external surface of the display module 100.

Figure 7:
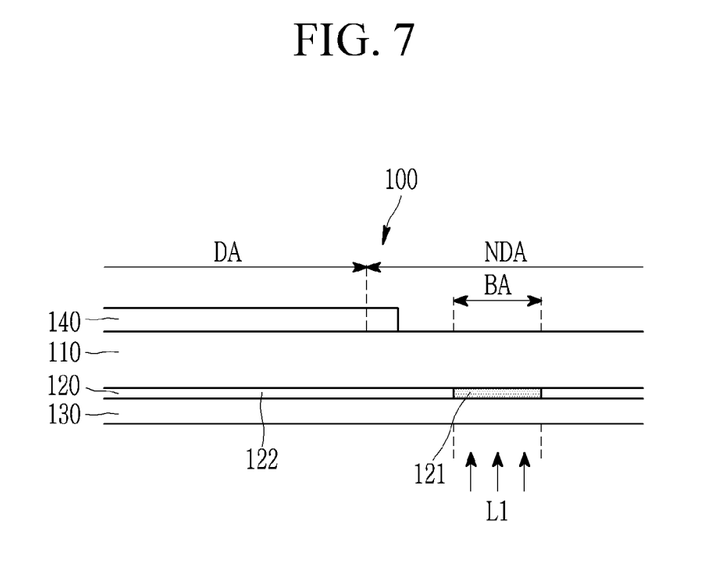

Referring to FIG. 5 and FIG. 7, a first laser L1 is irradiated to the stacked structure, at the bending area BA (S20).

The first laser L1 is irradiated in a direction from a lower portion of the display module 100 to an upper portion thereof, e.g., along a thickness direction of the stacked structure. The first laser L1 may be a CO2 laser. The CO2 laser may pass through the passivation film 130 including the polyimide. That is, the first laser L1 passes through the passivation film 130, and is irradiated on (e.g., incident to) the adhesive layer 120. Thus, irradiating the first laser L1 to the adhesive layer 120 divides the adhesive layer 120 into a first adhesive portion 121 and a second adhesive portion 122. The first adhesive portion 121 and the second adhesive portion 122 may together define an entirety of the adhesive layer 120, but is not limited thereto. That is, the second adhesive portion 122 may be a remaining portion of the adhesive layer 120 except for the first adhesive portion 121.

The first adhesive portion 121 is disposed in the bending area BA and is a laser-irradiated portion of the adhesive layer 120, and the second adhesive portion 122 is disposed outside of the bending area BA and is a non-irradiated portion of the adhesive layer 120. An adhesive force of the first adhesive portion 121 is weaker than that of the second adhesive portion 122. That is, by irradiating the stacked structure at the bending area BA with the first laser L1, the adhesive force of the first adhesive portion 121 of the adhesive layer 120 disposed in the bending area BA may be weakened as compared with the adhesive force of the second adhesive portion 122 of the adhesive layer 120. The irradiating of the first laser L1 through the passivation film 130 and to the adhesive layer 120 at the bending area reduces an adhesive force of the first adhesive portion 121 to be smaller than an adhesive force of the second adhesive portion 122, and provide the first adhesive portion 121 having a reduced adhesive force.

Figure 8:
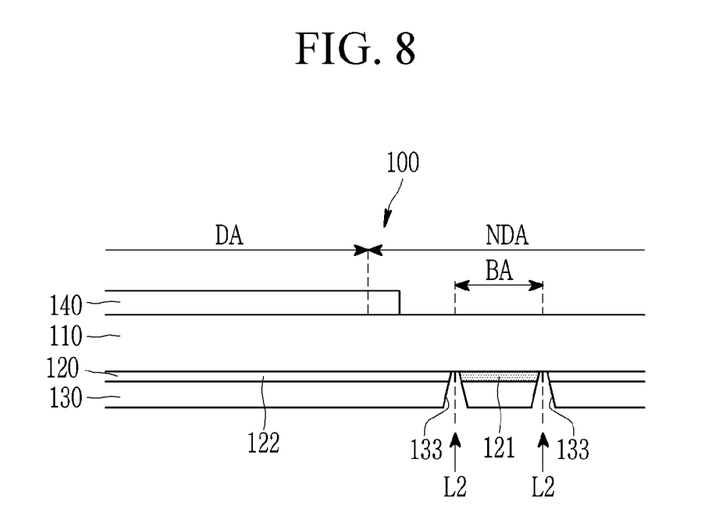

Referring to FIG. 5 and FIG. 8, a groove 133 is provided or formed in both the passivation film 130 and the adhesive layer 120 along a boundary of the bending area BA (S30). A portion of the groove 133 defined in the passivation film 130 and a portion of the groove 133 defined in the adhesive layer 120 are aligned with each other to together form the groove 133. The portions of the groove 133 may extend completely through respective thicknesses of the passivation film 130 and the adhesive layer 120. The groove 133 is provided or formed by irradiating a second laser L2 along the boundary of the bending area BA (e.g., boundary shown at dotted line in FIG. 8). Referring to FIG. 1, the bending area BA may form two boundaries having lengths extending along the horizontal direction. As such, the groove 133 may be provided in plurality respectively at the two boundaries.

A second laser L2 is irradiated along a direction from a lower portion of the display module 100 to an upper portion thereof. The second laser L2 is a $CO_2$ laser. In this case, intensity of the second laser L2 is greater than that of the first laser L1. The invention is not limited thereto, and the second laser L2 may be an ultraviolet laser. As the second laser L2 is irradiated along the boundary of the bending area BA, portions of the passivation film 130 and the adhesive layer 120 disposed at the boundary of the bending area BA are removed, to provide disconnected portions of the passivation film 130 and the adhesive layer 120 and thus the groove 133 is provided or formed. That is, the first adhesive portion 121 may be disconnected from the second adhesive portion 122.

A width of the groove 133 taken along the display panel 110 (e.g., horizontal direction in FIG. 8) may decrease in a direction from a lower portion of the display module 100 to an upper portion thereof. That is, portions of the passivation film 130 and the adhesive layer 120 which define the groove 133

Figure 9:
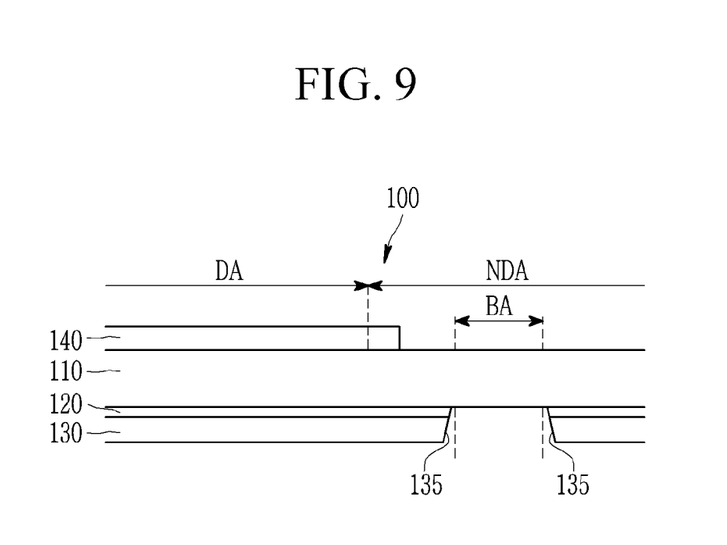

Referring to FIG. 5 and FIG. 9, a disconnected portion of the passivation film 130 and the first adhesive portion 121 of the adhesive layer 120 disposed in the bending area BA are removed (S40). Where the disconnected portion of the passivation film 130 is attached to the first adhesive portion 121 of the adhesive layer 120, the disconnected portion of the passivation film 130 may be remove together with the first adhesive portion 121. Thus, the opening 135 overlapping the bending area BA is provided or formed. That is, the passivation film 130 and the adhesive layer 120 include the opening 135 corresponding to and overlapping with the bending area BA.

In this case, the disconnected portion of the passivation film 130 and the first adhesive portion 121 of the adhesive layer 120 disposed in the bending area BA may be easily removed individually or together, such as by using an adhesive tape or the like may be used. The disconnected portion of the passivation film 130 and the first adhesive portion 121 of the adhesive layer 120 disposed in the bending area BA may be easily removed, because the adhesive force of the first adhesive portion 121 is weakened by irradiating the adhesive layer 120 with the first laser L1.

In one or more embodiment, after weakening the adhesive force of the first adhesive portion 121 of the adhesive layer 120 which is disposed in the bending area BA, by irradiating the $CO_2$ laser capable of passing through the passivation film 130 including the polyimide, portions of both the passivation film 130 and the adhesive layer 120 are disconnected from remaining portions of these layers along the boundary of the bending area BA to form the groove 133. Then, the disconnected portion of the passivation film 130 and the first adhesive portion 121 of the adhesive layer 120 disposed in the bending area BA are relatively easily removed owing to the weakening of the adhesive force at the first adhesive portion 121. As such errors in removing portions of the passivation film 130 and the adhesive layer 120 disposed in the bending area BA are reduced as compared to a case in which such portion are removed with a laser.

Referring to FIG. 5 and FIG. 1 to FIG. 3, the flexible printed circuit film 200 and the printed circuit board 300 are connected to the display module 100 (S50). In this case, a first end of the flexible printed circuit film 200 is attached to the non-display area NDA of the display module 100, and a second end of the flexible printed circuit film 200 which is opposite to the first end thereof is attached to the printed circuit board 300. The driving circuit portion 250 is disposed on the flexible printed circuit film 200.

In addition, referring again to FIG. 3, the display module 100 may be bent at the bending area BA. The display module 100 which is bent, disposes two portions of the passivation film 130 which are disconnected from each other at the opening 135, to face each other.

In one or more embodiment, it is described that the bending area BA is disposed in the non-display area NDA, but the invention is not limited thereto, and the bending area BA may also be disposed in the display area DA. This will be described with reference to FIG. 10 to FIG. 12.

Figure 10:
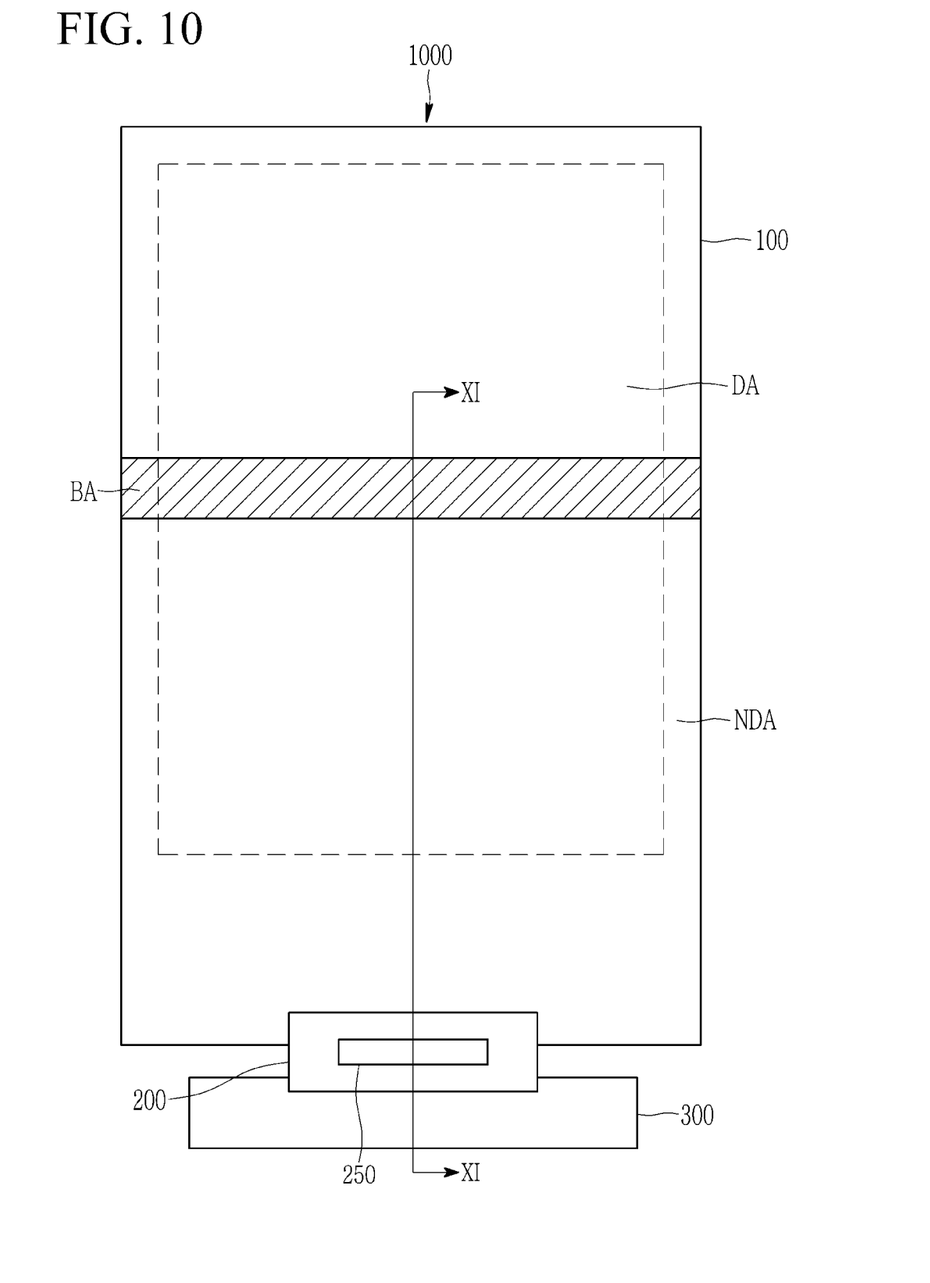
FIG. 10 schematically illustrates a top plan view of another embodiment of a display device.
Figure 11:
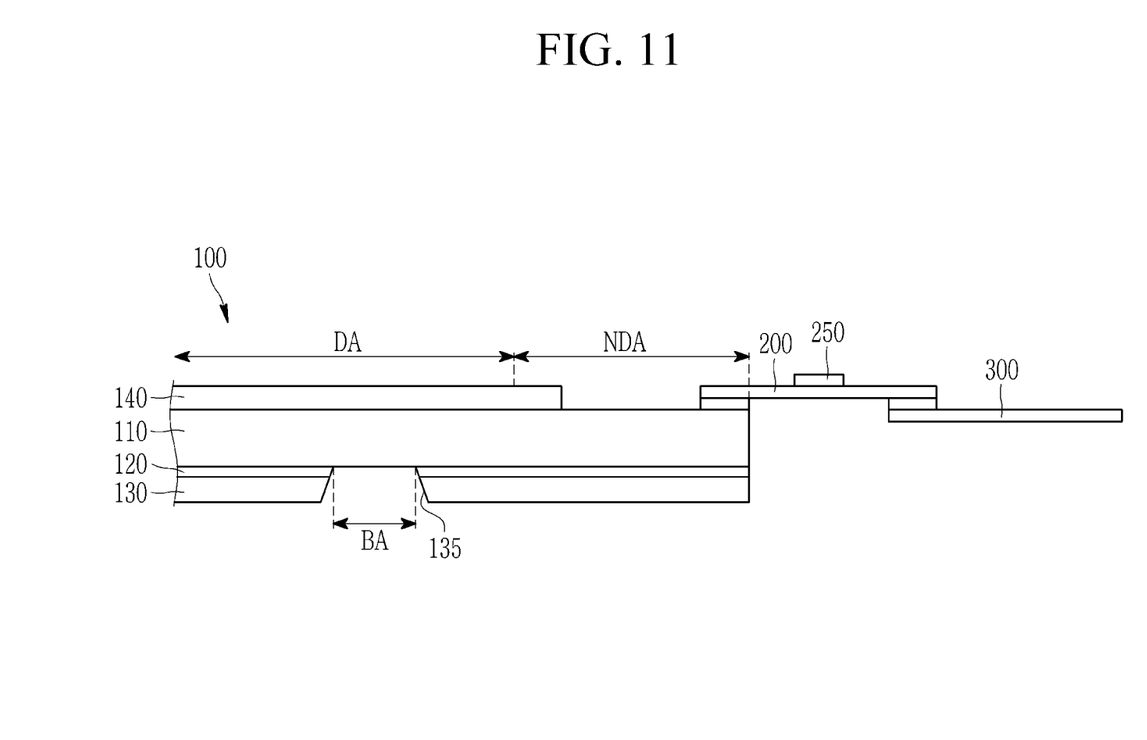
FIG. 11 is a cross-sectional view taken along line XI-XI of FIG. 10.
Figure 12:
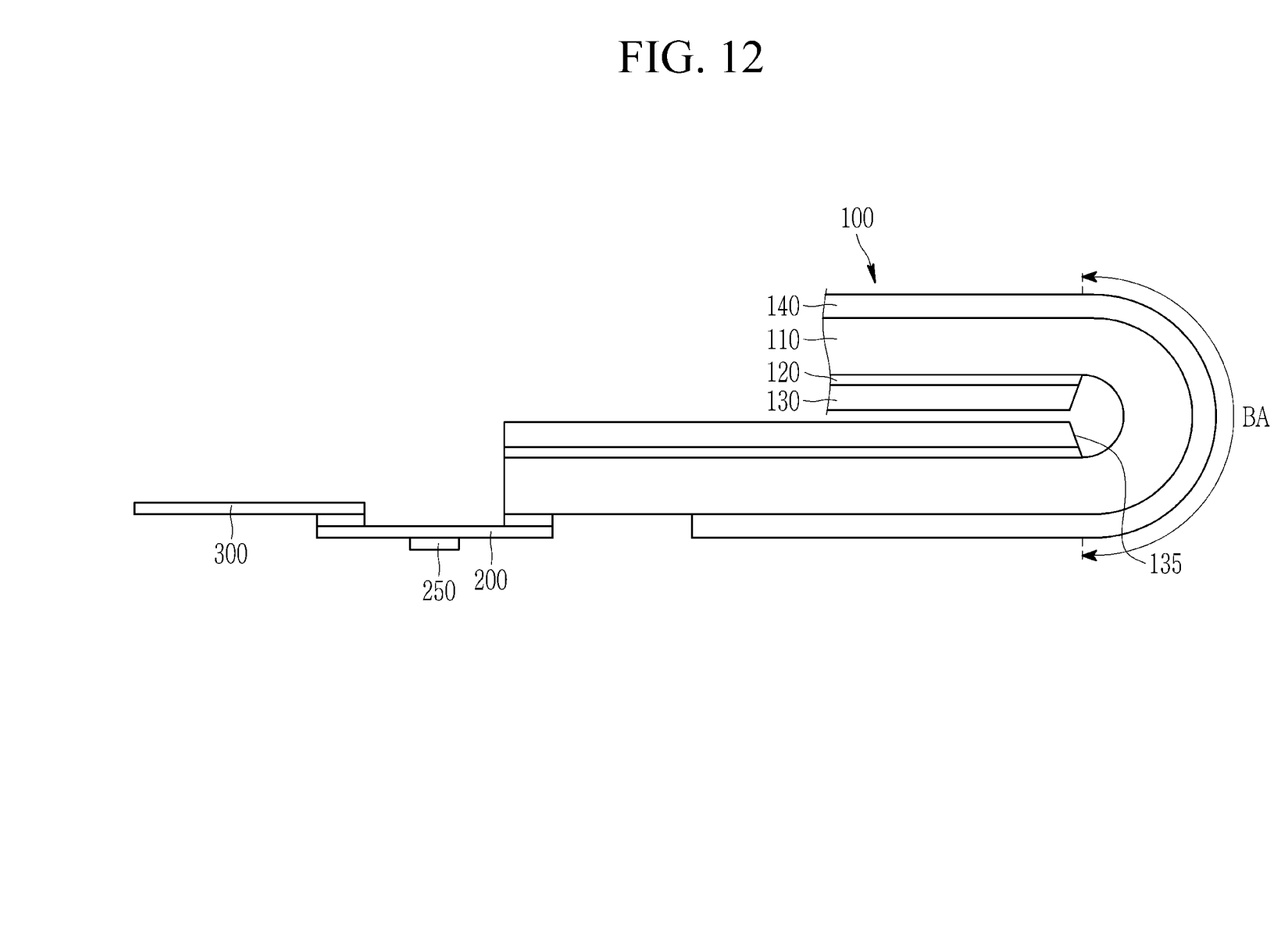
FIG. 12 schematically illustrates a side view of the display device of FIG. 10, which is bent.

FIG. 10 schematically illustrates a top plan view of another embodiment of a display device. FIG. 11 is a cross-sectional view taken along line XI-XI of FIG. 10. FIG. 12 schematically illustrates a side view of the display device of FIG. 10 which is bent.

Referring to FIG. 10 to FIG. 12, the display device 1000 is the same as the display device 1000 according to FIG. 1, except for a position of the bending area BA. Accordingly, duplicated descriptions of the same portions will be omitted, or will be simply described.

The display device 1000 includes the display module 100, the printed circuit board 300, and the flexible printed circuit film 200 for connecting the display module 100 and the printed circuit board 300 to each other.

The display module 100 includes the display area DA and the non-display area NDA. In addition, the display module 100 includes the bending area BA disposed in the display area DA. The display device 1000, the display module 100 and/or various components thereof may be bendable at the bending area BA.

The display module 100 includes the display panel 110, the passivation film 130, the adhesive layer 120 and the polarizing layer 140. The passivation film 130 is disposed below the display panel 110, and the adhesive layer 120 may attach the display panel 110 and the passivation film 130 to each other. The polarizing layer 140 is disposed on the display panel 110. The passivation film 130 may include a polyimide ("RI"). The passivation film 130 and the adhesive layer 120 include or define the opening 135 corresponding to or overlapping with the bending area BA.

The display module 100 may be bendable at the bending area BA. As shown in FIG. 12, the display module 100 which is bent, disposes two portions of the passivation film 130 which are disconnected or separated from each other at the opening 135 to face each other.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A manufacturing method of a display device, the method comprising:
provid ing a display module which is bendable at a bending area thereof, the display module including:
a display panel which displays an image,
a passivation film including a polyimide, the passivation film disposed in the bending area and outside of the bending area, and
an adhesive layer which attaches the display panel to the passivation film, the adhesive layer comprising a first adhesive portion in the bending area and a second adhesive portion outside of the bending area; and
providing a groove in the passivation film and in the adhesive layer, along a boundary of the bending area by:
reducing an adhesive force of the first adhesive portion of the adhesive layer to be smaller than an adhesive force of the second adhesive portion of the adhesive layer, by irradiating a first laser to the adhesive layer at the bending area, to provide the first adhesive portion which has reduced adhesive force, and
removing a portion of the passivation film and a portion of the adhesive layer which has the reduced adhesive force at the boundary of the bending area, by irradiating a second laser to the passivation film and the adhesive layer along the boundary of the bending area,
wherein an intensity of the first laser which provides the first adhesive portion which has reduced adhesive force is less than an intensity of the second laser which removes the a portion of the passivation film and a portion of the adhesive layer at the boundary of the bending area.

2. The manufacturing method of the display device of claim 1, wherein the first laser is irradiated through the passivation film and to the adhesive layer to provide the first adhesive portion which has the reduced adhesive force.

3. The manufacturing method of the display device of claim 1, wherein the second laser is irradiated in a direction from the passivation film to the adhesive layer.

4. The manufacturing method of the display device of claim 3, wherein a width of the groove taken along the display panel decreases in the direction from the passivation film to the display panel.

5. The manufacturing method of the display device of claim 4, wherein the first laser is a $CO_2$ laser and the second laser is a $CO_2$ laser.

6. The manufacturing method of the display device of claim 4, wherein the first laser is a $CO_2$ laser and the second laser is an ultraviolet laser.

7. The manufacturing method of the display device of claim 1, wherein the display module includes a display area at which the image is displayable and a non-display area which is adjacent to the display area.

8. The manufacturing method of the display device of claim 7, wherein the bending area at which the display module is bendable is disposed in the non-display area.

9. The manufacturing method of the display device of claim 7, wherein the bending area at which the display module is bendable is disposed in the display area.

10. The manufacturing method of the display device of claim 1, further comprising bending the display module from which the passivation film and the first adhesive portion which has the reduced adhesive force have been removed, at the bending area.

\* \* \* \* \*